(12) United States Patent
Moon et al.

(10) Patent No.: US 9,997,649 B2
(45) Date of Patent: Jun. 12, 2018

(54) ELECTRODE COMPOSITION, ELECTRODE MANUFACTURED USING THE SAME, AND SOLAR CELL

(71) Applicant: SAMSUNG SDI CO., LTD., Yongin-si, Gyeonggi-do (KR)

(72) Inventors: Sung-Il Moon, Suwon-si (KR); Seung-Chul Lyu, Suwon-si (KR); Hyung-Seok Park, Suwon-si (KR); Young-Sil Lee, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 165 days.

(21) Appl. No.: 15/049,161

(22) Filed: Feb. 22, 2016

(65) Prior Publication Data
US 2016/0322520 A1 Nov. 3, 2016

(30) Foreign Application Priority Data
Apr. 28, 2015 (KR) ........................ 10-2015-0059899

(51) Int. Cl.
*H01B 1/16* (2006.01)
*H01L 31/0224* (2006.01)
*H01B 1/22* (2006.01)

(52) U.S. Cl.
CPC ....... *H01L 31/022425* (2013.01); *H01B 1/16* (2013.01); *H01B 1/22* (2013.01); *Y02E 10/50* (2013.01)

(58) Field of Classification Search
CPC ... H01B 1/00; H01B 1/16; H01B 1/22; C09D 5/24
See application file for complete search history.

(56) References Cited

U.S. PATENT DOCUMENTS 4,267,091 A 5/1981 Geelhaar et al.
5,157,093 A * 10/1992 Harisiades ............ C08F 290/10
522/89

(Continued)

FOREIGN PATENT DOCUMENTS

CN 102934268 A 2/2013
CN 104277747 A 1/2015

(Continued)

OTHER PUBLICATIONS

Search Report from the Office Action dated Apr. 6, 2017 of the corresponding Chinese Patent Application No. 201610109510.1.

(Continued)

*Primary Examiner* — Mark Kopec
(74) *Attorney, Agent, or Firm* — Lee & Morse, P.C.

(57) ABSTRACT

An electrode composition, an electrode, and a solar cell, the composition including a conductive powder; glass frit; an organic binder; and a solvent, wherein the organic binder is a compound that includes a moiety represented by Chemical Formula 1:

[Chemical Formula 1]

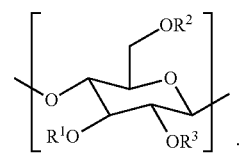

16 Claims, 1 Drawing Sheet

(56) References Cited

U.S. PATENT DOCUMENTS

| | | |
|---|---|---|
| 2006/0216529 A1 | 9/2006 | Barker et al. |
| 2008/0131783 A1 | 6/2008 | Choi et al. |
| 2015/0249167 A1* | 9/2015 | Zhang .................... H01B 1/22 |
| | | 427/123 |

FOREIGN PATENT DOCUMENTS

| | | |
|---|---|---|
| EP | 2 998 969 A1 | 3/2016 |
| EP | 3 026 674 A1 | 6/2016 |
| JP | 2003/051344 A | 2/2003 |
| KR | 10-2012-0037364 A | 4/2012 |
| KR | 10-2013-0014599 A | 2/2013 |
| KR | 10-2014-0143293 A | 12/2014 |
| TW | 201527244 A | 7/2015 |

OTHER PUBLICATIONS

Search Report from the Notice of Allowance dated Mar. 30, 2017 of the corresponding Taiwanese Patent Application No. 105107987.

* cited by examiner

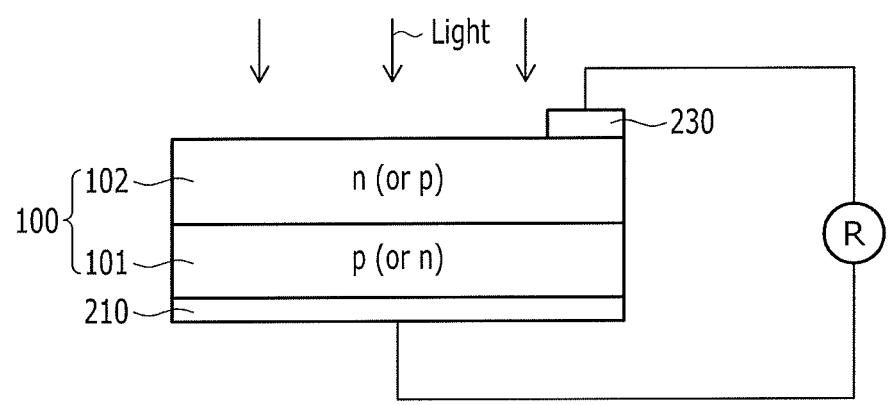

ELECTRODE COMPOSITION, ELECTRODE MANUFACTURED USING THE SAME, AND SOLAR CELL

CROSS-REFERENCE TO RELATED APPLICATION

Korean Patent Application No. 10-2015-0059899, filed on Apr. 28, 2015, in the Korean Intellectual Property Office, and entitled: "Electrode Composition, Electrode Manufactured Using the Same, and Solar Cell," is incorporated by reference herein in its entirety.

BACKGROUND

1. Field

Embodiments relate to an electrode composition, an electrode manufactured therefrom, and a solar cell.

2. Description of the Related Art

Solar cells generate electrical energy using the photovoltaic effect of a p-n junction, which converts photons of, e.g., sunlight, into electricity. In the solar cell, front and rear electrodes may be formed on front and rear surfaces of a semiconductor wafer or substrate with the p-n junction, respectively. Then, the photovoltaic effect of the p-n junction may be induced by, e.g., sunlight, entering the semiconductor wafer and electrons generated by the photovoltaic effect of the p-n junction may provide an electric current to the outside through the electrodes.

SUMMARY

Embodiments are directed to an electrode composition, an electrode manufactured therefrom, and a solar cell.

The embodiments may be realized by providing an electrode composition including a conductive powder; glass frit; an organic binder; and a solvent, wherein the organic binder is a compound that includes a moiety represented by Chemical Formula 1:

[Chemical Formula 1]

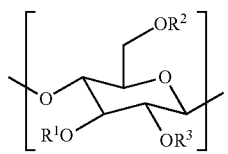

wherein, in Chemical Formula 1, $R^1$, $R^2$, and $R^3$ are each independently selected from hydrogen, a substituted or unsubstituted linear or branched C1 to C15 alkyl group, a substituted or unsubstituted linear or branched C2 to C15 alkenyl group, a substituted or unsubstituted C3 to C20 cycloalkyl group, a substituted or unsubstituted C3 to C20 heterocycloalkyl group, a substituted or unsubstituted C3 to C20 aryl group, a substituted or unsubstituted C3 to C20 heteroaryl group, and a group represented by Chemical Formula 2, provided that at least one of $R^1$, $R^2$, and $R^3$ is a group represented by Chemical Formula 2:

[Chemical Formula 2]

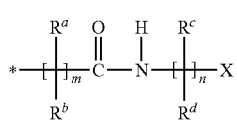

wherein, in Chemical Formula 2, $R^a$, $R^b$, $R^c$, and $R^d$ are each independently hydrogen or a linear or branched C1 to C10 alkyl group, m is an integer of 1 to 10, n is an integer of 0 to 10, X is selected from a substituted or unsubstituted linear or branched C1 to C18 alkyl group, a hydroxy group, a halogen, a carboxyl group, an ester group represented by —COOR, in which R is a linear or branched C1 to C6 alkyl group, a phosphoric acid group, a phosphoric acid ester group represented by —O—P(=O)(OR)$_2$, in which R is a linear or branched C1 to C6 alkyl group, a substituted or unsubstituted C3 to C20 cycloalkyl group, a substituted or unsubstituted C6 to C20 aryl group, and a substituted or unsubstituted 5-membered or 6-membered alicyclic group including N, O, S, or a combination thereof, and * indicates a point where the substituent is linked to oxygen of $OR^1$, $OR^2$, or $OR^3$ of Chemical Formula 1.

In Chemical Formula 2, at least one substituted or unsubstituted methylene group (—(C($R^a$)($R^b$))— or —(C($R^c$)($R^d$))—) that is not adjacent to the amide group may be replaced by a linking group selected from —O—, —S—, —C(=O)—, —S(=O)—, —S(=O)$_2$—, —C(=O)—O—, —O—C(=O)—, —C(=O)NR— (wherein R is hydrogen or a C1 to C6 alkyl group), and a combination thereof.

The substituted or unsubstituted 5-membered or 6-membered alicyclic group including N, O, S, or a combination thereof may be selected from an imidazolyl group, an imidazolinyl group, a pyrazolyl group, a pyrazolinyl group, a pyrrolinyl group, a triazolyl group, a tetrazolyl group, a furfuryl group, and an isoxazolyl group.

A weight average molecular weight of the compound including the moiety represented by Chemical Formula 1 may be about 5,000 to about 200,000 g/mol.

The compound represented by Chemical Formula 1 may include one or two substituents represented by Chemical Formula 2 per the moiety represented by Chemical Formula 1.

The electrode composition may include about 60 to about 95 wt % of the conductive powder; about 0.5 to about 20 wt % of the glass fit; about 1 to about 20 wt % of the organic binder; and a balance amount of the solvent.

The glass frit may include at least one selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

The solvent may include at least one selected from methyl cellosolve, ethyl cellosolve, butyl cellosolve, an aliphatic alcohol, α-terpineol, β-terpineol, dihydro-terpineol, ethylene glycol, ethylene glycol monobutyl ether, butyl cellosolve acetate, and 2,2,4-trimethyl-1,3-pentanediol monoisobutyrate.

The glass frit may have an average particle diameter (D50) of about 0.1 μm to about 10 μm.

The electrode composition may further include at least one selected from a surface-treatment agent, a dispersing agent, a thixotropic agent, a plasticizer, a viscosity stabilizer, an antifoaming agent, a pigment, an ultraviolet stabilizer, an antioxidant, and a coupling agent.

The embodiments may be realized by providing an electrode manufactured using the electrode composition according to an embodiment.

The embodiments may be realized by providing a solar cell including the electrode according to an embodiment.

The embodiments may be realized by providing a method of manufacturing a solar cell, the method including applying the electrode composition according to an embodiment onto a substrate; and heating the composition to form an electrode on the substrate.

BRIEF DESCRIPTION OF THE DRAWING

Features will be apparent to those of skill in the art by describing in detail exemplary embodiments with reference to the attached drawing in which:

FIG. 1 illustrates a schematic view showing a structure of a solar cell according to one embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when specific definition is not otherwise provided, the term "substituted" refers to one substituted with a halogen (F, Cl, Br, or I), a hydroxy group, a C1 to C20 alkoxy group, a nitro group, a cyano group, an amino group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof, instead of at least one hydrogen.

As used herein, when specific definition is not otherwise provided, the term "hetero" refers to one including at least one heteroatom selected from N, O, S, and P in a cyclic group.

An electrode composition according to an embodiment may include, e.g., a conductive powder, glass frit, an organic binder, and a solvent.

The electrode composition may include, e.g., a metal powder, as a conductive powder. The metal powder may include silver (Ag), gold (Au), palladium (Pd), platinum (Pt), ruthenium (Ru), rhodium (Rh), osmium (Os), iridium (Ir), rhenium (Re), titanium (Ti), niobium (Nb), tantalum (Ta), aluminum (Al), copper (Cu), nickel (Ni), molybdenum (Mo), vanadium (V), zinc (Zn), magnesium (Mg), yttrium (Y), cobalt (Co), zirconium (Zr), iron (Fe), tungsten (W), tin (Sn), chromium (Cr), manganese (Mn), or the like.

A particle size of the conductive powder may be nanometer or micrometer scale. For example, the conductive powder may have a particle size of dozens to several hundred nanometers, or several to dozens of micrometers. In an implementation, the conductive powder may be a mixture of two or more types of silver powders having different particle sizes.

The conductive powder may have a particle shape of, e.g., a spherical shape, a sheet-shape, or an amorphous shape. In an implementation, the conductive powder may have an average particle diameter (D50) of about 0.1 μm to about 10 μm, e.g., about 0.5 μm to about 5 μm. The average particle diameter may be measured using, e.g., Model 1064D (CILAS Co., Ltd.) equipment after dispersing the conductive powder in isopropyl alcohol (IPA) at room or ambient temperature (about 24° C. to about 25° C.) for 3 minutes via ultrasonication. Within this range of average particle diameter, the composition may provide low contact resistance and low line resistance.

The conductive powder may be present in the composition in an amount of about 60 wt % to about 95 wt %, based on a total weight (100 wt %) of the electrode composition. Within this range, deterioration in conversion efficiency due to an increase in resistance may be reduced and/or prevented, and hard formation of paste caused by a relative decrease of an organic vehicle may also be reduced and/or prevented. In an implementation, the conductive powder may be present in an amount of about 70 wt % to about 90 wt %.

The glass frit may enhance adhesion between the conductive powder and the wafer or the substrate and may facilitate formation of silver crystal grains in an emitter region by etching an anti-reflection layer and melting the conductive powder so as to reduce contact resistance during a firing process of the electrode paste. Further, during the sintering process, the glass frit may be softened and may decrease the firing temperature.

When the area of the solar cell is increased in order to help improve solar cell efficiency, there is a possibility that contact resistance of the solar cell may be increased. Thus, it is desirable to minimize the influence on the p-n junction while minimizing series resistance (Rs). In addition, the firing temperature may vary within a broad range with increasing use of various wafers having different sheet resistances. It is desirable for the glass frit to secure sufficient thermal stability to withstand a wide range of firing temperatures.

The glass frit may include a leaded glass frit and/or a non-lead glass frit suitable for an electrode composition.

The glass frit may further include at least one element, e.g., a metal or semi-metal element, selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

The glass frit may be prepared from oxides of the elements, e.g., metal or semi-metal elements, by a suitable method. For example, the metal or semi-metal oxides may be obtained by mixing the oxides of the elements, e.g., metal or semi-metal elements, in a predetermined ratio, melting the mixture, quenching the resultant, and then pulverizing the quenched product. Mixing may be performed using, e.g., a ball mill or a planetary mill. The melting may be performed at about 700° C. to about 1,300° C. and the quenching may be performed at ambient temperature (about 24° C. to about 25° C.). The pulverizing may be performed using, e.g., a disk mill or a planetary mill.

The glass frit may have an average particle diameter (D50) of about 0.1 μm to about 10 μm, and may be present in an amount of about 0.5 wt % to about 20 wt %, based on the total weight (100 wt %) of the electrode composition. Within this range, the glass frit may help secure excellent adhesive strength of an electrode without deteriorating electrical characteristics of an electrode.

The glass fit may have a spherical shape or an amorphous shape. In an implementation, two different kinds of glass fit having different transition temperatures may be used. For example, a first glass frit having a transition temperature of greater than or equal to about 200° C. to less than or equal to about 350° C., and a second glass fit having a transition temperature of greater than about 350° C. to less than or equal to about 550° C. may be mixed in a weight ratio of about 1:0.2 to about 1:1.

In an implementation, the organic binder may be represented by Chemical Formula 1.

[Chemical Formula 1]

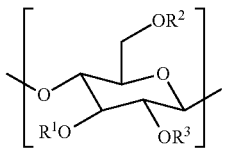

In Chemical Formula 1, $R^1$, $R^2$, and $R^3$ may each independently be or include, e.g., hydrogen, a substituted or unsubstituted linear or branched C1 to C15 alkyl group, a substituted or unsubstituted linear or branched C2 to C15 alkenyl group, a substituted or unsubstituted C3 to C20 cycloalkyl group, a substituted or unsubstituted C3 to C20 heterocycloalkyl group, a substituted or unsubstituted C3 to C20 aryl group, a substituted or unsubstituted C3 to C20 heteroaryl group, and a substituent or group represented by Chemical Formula 2, below. In an implementation, at least one of $R^1$, $R^2$, and $R^3$ may be a group represented by Chemical Formula 2.

[Chemical Formula 2]

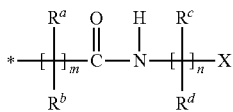

In Chemical Formula 2, $R^a$, $R^b$, $R^c$, and $R^d$ may each independently be hydrogen or a linear or branched C1 to C10 alkyl group, e.g., a linear or branched C1 to C6 alkyl group.

m may be an integer of 1 to 10, and n may be an integer of 0 to 10.

X may be selected from or include, e.g., a substituted or unsubstituted linear or branched C1 to C18 alkyl group, a hydroxy group (—OH), a halogen (—F, —Cl, —Br, or —I), a carboxyl group (—COOH), an ester group (COOR, in which R is a linear or branched C1 to C6 alkyl group), a phosphoric acid group (phosphoric acid, —O—P(=O)OH)$_2$), a phosphoric acid ester group (—O—P(=O)(OR)$_2$, in which R is a linear or branched C1 to C6 alkyl group), a substituted or unsubstituted C3 to C20 cycloalkyl group, a substituted or unsubstituted C6 to C20 aryl group, and a substituted or unsubstituted 5-membered or 6-membered alicyclic group including N, O, S, or a combination thereof, and

* indicates a point where the substituent is linked to oxygen (O) of $OR^1$, $OR^2$, or $OR^3$ of Chemical Formula 1.

The substituted or unsubstituted linear or branched C1 to C15 alkyl group may include, e.g., a linear or branched C1 to C15 hydroxyalkyl group substituted with at least one hydroxy group.

The substituted or unsubstituted linear or branched C1 to C15 alkyl group may include, e.g., a methyl group, an ethyl group, an n-propyl group, a sec-butyl group, an isopropyl group, a n-amyl group, an isoamyl group, an isobutyl group, or the like.

In an implementation, in Chemical Formula 2, at least one substituted or unsubstituted methylene group (—(C($R^a$)($R^b$))— or —(C($R^c$)($R^d$))—) that is not adjacent to the amide group (e.g., when m or n is 2 or greater) may be replaced by a linking group selected from —O—, —S—, —C(=O)—, —S(=O)—, —S(=O)$_2$—, —C(=O)—O—, —O—C(=O)—, —C(=O)NR— (in which R is hydrogen or a C1 to C6 alkyl group), and a combination thereof. When at least two methylene groups are replaced by at least two linking groups, the linking groups may not be adjacent to each other.

In an implementation, at least one substituted or unsubstituted methylene group of the substituted or unsubstituted linear or branched C1 to C15 alkyl group or the substituted or unsubstituted linear or branched C1 to C18 alkyl group may be replaced by a linking group selected from —O—, —S—, —C(=O)—, —S(=O)—, —S(=O)$_2$—, —C(=O)—O—, C(=O)—, —C(=O)NR— (in which R is hydrogen or a C1 to C6 alkyl group), and a combination thereof. When at least two methylene groups are replaced by at least two linking groups, the linking groups may not be adjacent to each other. When n is 0 in Chemical Formula 2, the linking group may not be present with continuation with or adjacent to the amide group of Chemical Formula 2.

The substituted or unsubstituted 5-membered or 6-membered alicyclic group including N, O, S, or a combination thereof may be selected from an imidazolyl group, an imidazolinyl group, a pyrazolyl group, a pyrazolinyl group, a pyrrolinyl group, a triazolyl group, a tetrazolyl group, a furfuryl group, and an isoxazolyl group.

In an implementation, the compound represented by Chemical Formula 1 may be prepared by reacting cellulose or a cellulose derivative with a compound including an amide group and represented by Chemical Formula 2a.

[Chemical Formula 2a]

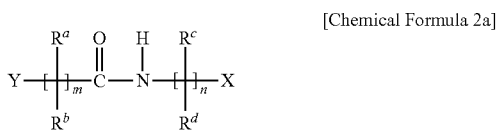

In Chemical Formula 2a, $R^a$, $R^b$, $R^c$, $R^d$, m, n, and X are the same as in Chemical Formula 2, and Y may be a reactive group, e.g., a halogen. For example, Y may be a chloro group (—Cl) that reacts with a hydroxy group or an alkoxy group of the cellulose derivative.

The compound including an amide group may be obtained by reacting a compound having a carboxylic acid group and an amine compound.

The organic binder may include at least one substituent or group having an amide group (represented by Chemical Formula 2) at or on a cellulose main chain, and thus may help improve print characteristics, dispersion, and storage stability of the electrode composition. In addition, the organic binder may form an entanglement structure among components of the electrode composition, e.g., among the organic binders having the cellulose main chain therein or conductive powder particles, and thus may make the components closely contact one another. In addition, the organic binder may improve wettability of a substrate and thus affinity of the electrode composition with the substrate. Accordingly, when the electrode composition is printed on the substrate, the electrode composition may not be undesirably spread, and may be prevented from increasing the width of an electrode pattern, thereby maintaining its uniform width. Thus, a fine pattern having a high aspect ratio (the cross-section height of the electrode pattern/the cross-sectional width of the electrode pattern) may be realized.

In addition, the organic binder may help increase hydrogen bonding among organic binders and may help decrease a phenomenon in which a width becomes wide, while a paste is crushed by heat generated during firing and thus may realize a fine pattern having a high aspect ratio, and may also have excellent shear thinning due to a side chain effect and thus may help realize an electrode pattern with high resolution.

In addition, the organic binder may help improve compatibility between the post-described additives with organic binders and thus may help improve print characteristics of the electrode composition.

A weight average molecular weight (Mw) of the compound that includes a moiety represented by Chemical Formula 1 may be about 5,000 to about 200,000 g/mol. When the weight average molecular weight (Mw) is within the range, dispersion and print characteristics of the electrode composition may be improved.

The compound that includes a moiety represented by Chemical Formula 1 may include one or two groups represented by Chemical Formula 2 per the moiety represented by Chemical Formula 1, e.g., per moiety represented by Chemical Formula 1.

For example, when the group represented by Chemical Formula 2 is present, dispersion stability of the electrode composition may be improved, and a fine electrode pattern having a high aspect ratio may be obtained.

The group represented by Chemical Formula 2 may be positioned at any of $R^1$ (No. 3 position), $R^2$ (No. 6 position), or $R^3$ (No. 2 position) of the the moiety represented by Chemical Formula 1.

The organic binder may be present in the composition in an amount of about 0.1 to about 20 wt %, e.g., about 0.2 to about 15 wt %, based on the total weight (100 wt %) of the electrode composition. When the organic binder is used within the range, the electrode composition may have appropriate viscosity and be prevented from adherence deterioration to the substrate, and may also have high resistance due to unsmooth decomposition of the organic binder during firing and prevent an electrode from being cracked, being opened, having a pin hole, and the like during the firing.

The solvent may have a boiling point of about 100° C. or more. In an implementation, the solvent may include, e.g., methyl cellosolve, ethyl cellosolve, butyl cellosolve, an aliphatic alcohol, α-terpineol, β-terpineol, dihydro-terpineol, ethylene glycol, ethylene glycol monobutyl ether, butyl cellosolve acetate, Texanol (2,2,4-trimethyl-1,3-pentanediol monoisobutyrate), or the like, and may be used alone or in a combination of two or more.

In an implementation, the solvent may be present in a balance amount. In an implementation, the solvent may be present in an amount of, e.g., about 1 to about 30 wt %, based on the total weight of the electrode composition.

When the solvent is used within the range, sufficient adhesion strength and excellent print characteristics may be secured.

The electrode composition may further include a suitable additive, as desired, to enhance flow properties, process properties, and stability. The additive may include, e.g., a surface-treatment agent, a dispersing agent, a thixotropic agent, a plasticizer, a viscosity stabilizer, an antifoaming agent, a pigment, an ultraviolet (UV) stabilizer, an antioxidant, a coupling agent, or the like. These additives may be used alone or as mixtures thereof.

The additive may be present in the composition in an amount of about 0.1 to about 5 wt %, based on the total weight (100 wt %) of the electrode composition. This amount may be adjusted or selected as desired. The amount of the additive may be selected with a view toward print characteristics, dispersion, and storage stability of the electrode composition.

Another embodiment provides an electrode formed from the electrode composition.

In addition, another embodiment provides a solar cell including the electrode.

Referring to FIG. 1, a solar cell according to one embodiment is illustrated. FIG. 1 illustrates a schematic view showing the structure of the solar cell according to one embodiment.

Referring to FIG. 1, an electrode composition may be printed on a wafer 100 including a p layer (or an n layer) 101 and an n layer (or a p layer) 102 as an emitter and fired, forming a rear electrode 210 and a front electrode 230. For example, a prior preparation step for the rear electrode 210 may be performed by printing the electrode composition on the rear surface of the wafer and drying at about 200° C. to about 400° C. for about 10 to about 60 seconds.

In addition, a prior preparation step for the front electrode 230 may be performed by printing the electrode composition on the front surface of the wafer and drying it. Then, the front and rear electrodes may be fired at about 400° C. to about 980° C., e.g., about 700° C. to about 980° C., for about 30 seconds to about 210 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example of Organic Binder

Synthesis Example 1

300 ml of 1,4-dioxane and 50 g of ethyl cellulose (STD200, Dow Chemical Co.) were put in a 1 L round flask, slowly heated up to 60° C., and agitated for 30 minutes to completely dissolve the ethyl cellulose. Then, the solution was cooled down to ambient temperature, 23 g of triethylamine (TEA, Sigma-Aldrich Co.) was added thereto, and the mixture was agitated for 10 minutes. 11 g of N-butyl-2-chloroacetamide (Sigma-Aldrich Co.) was slowly added thereto under a nitrogen gas ($N_2$) atmosphere, and the mixture was slowly heated up to 60° C. and agitated for 5 hours, completing a reaction. When the reaction was complete, a product therefrom was purified and dried, obtaining N-butyl-2-chloroacetamide-modified ethyl cellulose (CBA-1).

Synthesis Example 2

N-butyl-2-chloroacetamide-modified ethyl cellulose (CBA-2) was obtained according to the same method as in Synthesis Example 1, except for changing the amount of the N-butyl-2-chloroacetamide as shown in Table 1, below.

Synthesis Example 3

N-butyl-2-chloroacetamide-modified ethyl cellulose (CBA-3) was obtained according to the same method as in Synthesis Example 1, except for changing the amount of the N-butyl-2-chloroacetamide as shown in Table 1, below.

TABLE 1

|  | Ethyl cellulose | N-butyl-2-chloroacetamide |
|---|---|---|
| Synthesis Example 1 CBA-1 | 50 g | 11 g |
| Synthesis Example 2 CBA-2 | 50 g | 15 g |
| Synthesis Example 3 CBA-3 | 50 g | 26 g |

Preparation of Electrode Composition

Example 1

A solar cell electrode composition was prepared by sufficiently dissolving 0.8 wt % of the N-butyl-2-chloroacetamide-modified ethyl cellulose (CBA-1) of Synthesis Example 1 (as an organic binder) in 8.5 wt % of Texanol (as a solvent) at 50° C., adding 87.0 wt % of spherically-shaped silver powder (5-8F, Dowa Hightech Co. Ltd.) having an average particle diameter of 5.0 μm, 3.0 wt % of leaded glass (CI-124, Particlogy Co., Ltd.) frit having an average particle diameter of 1.0 μm, a transition point of 341° C., and a low melting point, and 0.2 wt % of a dispersing agent (BYK102, BYK-Chemie Inc.) and 0.5 wt % of a thixotropic agent (Thixatrol ST, Elementis Co.) as an additive thereto, and then uniformly mixing them and dispersing the mixture with a three-roll mixer.

Example 2

A solar cell electrode composition was prepared according to the same method as in Example 1, except for using the N-butyl-2-chloroacetamide-modified ethyl cellulose (CBA-2) according to Synthesis Example 2 instead of the CBA-1 according to Synthesis Example 1 as the organic binder.

Example 3

A solar cell electrode composition was prepared according to the same method as in Example 1, except for using the N-butyl-2-chloroacetamide-modified ethyl cellulose (CBA-3) according to Synthesis Example 3 instead of the CBA-1 according to Synthesis Example 1 as the organic binder.

Comparative Example 1

A solar cell electrode composition was prepared according to the same method as in Example 1, except for using ethyl cellulose (STD200, Dow Chemical Co.) instead of the CBA-1 according to Synthesis Example 1 as the organic binder.

Property Evaluation (1) Storage Stability

The storage stability (percentage) of the solar cell electrode compositions according to Examples 1 to 3 and Comparative Example 1 was evaluated by using a viscosity variation ratio before and after the storage obtained according to the following Equation 1, and the results are provided in the following Table 2.

$$\Delta F = \frac{F_1}{F_0} \times 100 \quad \text{[Equation 1]}$$

In Equation 1, $F_0$ is viscosity measured at ambient temperature (24° C.) after storing an electrode composition at 25° C. under relative humidity of 50±5% for 1 day, and $F_1$ is viscosity measured at ambient temperature (25° C.) after storing the electrode composition at 25° C. under relative humidity 50±5% for 30 days.

The viscosity measurements were obtained by using a viscosity meter (HBDV-2+pro, Brookfield Engineering Laboratories) and mounting a SC4-14 spindle and a SC4-6RP chamber thereon, and then pre-shearing the compositions at 25° C. and 10 rpm for 30 seconds.

(2) Fine Pattern Evaluation

The solar cell electrode compositions according to Examples 1 to 3 and Comparative Example 1 were respectively screen-printed on a front surface of a poly P-type silicon wafer having sheet resistance of 90Ω by using a screen mask to print an electrode pattern, and then dried by using an infrared ray drying furnace. Then, an electrode composition including aluminum was printed on the rear surface of the wafer and then dried in the same method as above. Subsequently, cells manufactured in the process were fired at about 400° C. to about 950° C. for about 40 seconds by using a belt-type furnace, and then the line width and thickness of the electrode lines were measured by using VK equipment (VK9710, KEYENCE Co.), and the results are provided in the following Table 2.

* Screen mask: SUS325 type/emulsion thickness of 15 μm/finger bar line: width of 35 μm, 90 finger bars

TABLE 2

|  |  | Example 1 | Example 2 | Example 3 | Comparative Example 1 |
|---|---|---|---|---|---|
| Composition (wt %) | Silver powder | 87 | 87 | 87 | 87 |
|  | Glass frit | 3.0 | 3.0 | 3.0 | 3.0 |
|  | Organic binder | 0.8 | 0.8 | 0.8 | 0.8 |
|  |  | (CBA-1) | (CBA-2) | (CBA-3) | (STD200) |
|  | Solvent | 8.5 | 8.5 | 8.5 | 8.5 |
|  | Additive | 0.7 | 0.7 | 0.7 | 0.7 |

TABLE 2-continued

| | | Example 1 | Example 2 | Example 3 | Comparative Example 1 |
|---|---|---|---|---|---|
| Properties | Storage stability (%) | 3.0 | 2.5 | 2.1 | 7 |
| | Line width after firing (μm) | 56 | 50 | 45 | 66 |
| | Thickness after firing (μm) | 20 | 21 | 22 | 19 |
| | Aspect ratio (thickness/line width) | 0.36 | 0.42 | 0.49 | 0.29 |

As may be seen in the Table 2, the solar cell electrode compositions using a compound represented by Chemical Formula 1 as an organic binder according to Examples 1 to 3 exhibited excellent storage stability, an excellent aspect ratio, and a fine line width, compared with the solar cell electrode composition using ethyl cellulose according to Comparative Example 1.

By way of summation and review, the electrodes of the solar cell may be formed with predetermined patterns on the surface of the wafer by, e.g., coating, patterning, and firing an electrode composition.

The conversion efficiency of the solar cell may be improved by improving contact properties of electrodes with a wafer, and thus minimizing contact resistance ($R_c$) and series resistance ($R_s$) or adjusting pattern line widths of a screen mask with an organic material to be smaller, and thus forming fine lines and increasing a shortcut current ($I_{sc}$). Reducing line widths of the electrode pattern with the screen mask may lead to increasing series resistance ($R_s$) and deteriorating continuous printability of a fine pattern.

An electrode composition may include an organic vehicle to impart suitable viscosity and rheological characteristics for printing, and the organic vehicle may include an organic binder and a solvent. The embodiments may provide an organic binder that helps improve printability of an electrode composition.

The embodiments may provide an electrode composition capable of providing a fine pattern having high resolution.

The electrode composition may provide a fine pattern having high resolution and improved printability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

<Description of Symbols>

| 101: p layer (or n layer) | 102: n layer (or p layer) |
|---|---|
| 210: rear electrode | 230: front electrode |

What is claimed is:
1. An electrode composition, comprising:
a conductive powder;
glass frit;
an organic binder; and
a solvent, wherein the organic binder is a compound that includes a moiety represented by Chemical Formula 1:

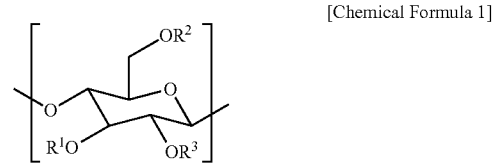

[Chemical Formula 1]

wherein, in Chemical Formula 1,
$R^1$, $R^2$, and $R^3$ are each independently selected from hydrogen, a substituted or unsubstituted linear or branched C1 to C15 alkyl group, a substituted or unsubstituted linear or branched C2 to C15 alkenyl group, a substituted or unsubstituted C3 to C20 cycloalkyl group, a substituted or unsubstituted C3 to C20 heterocycloalkyl group, a substituted or unsubstituted C3 to C20 aryl group, a substituted or unsubstituted C3 to C20 heteroaryl group, and a group represented by Chemical Formula 2, provided that at least one of $R^1$, $R^2$, and $R^3$ is a group represented by Chemical Formula 2:

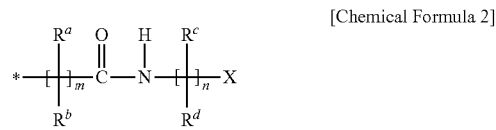

[Chemical Formula 2]

wherein, in Chemical Formula 2,
$R^a$, $R^b$, $R^c$, and $R^d$ are each independently hydrogen or a linear or branched C1 to C10 alkyl group,
m is an integer of 1 to 10,
n is an integer of 0 to 10,
X is selected from a substituted or unsubstituted linear or branched C1 to C18 alkyl group, a hydroxy group, a halogen, a carboxyl group, an ester group represented by —COOR, in which R is a linear or branched C1 to C6 alkyl group, a phosphoric acid group, a phosphoric acid ester group represented by —O—P(=O)(OR)$_2$, in which R is a linear or branched C1 to C6 alkyl group, a substituted or unsubstituted C3 to C20 cycloalkyl group, a substituted or unsubstituted C6 to C20 aryl group, and a substituted or unsubstituted 5-membered or 6-membered alicyclic group including N, O, S, or a combination thereof, and
* indicates a point where the substituent is linked to oxygen of $OR^1$, $OR^2$, or $OR^3$ of Chemical Formula 1.
2. The electrode composition as claimed in claim 1, wherein the substituted or unsubstituted 5-membered or 6-membered alicyclic group including N, O, S, or a combination thereof is selected from an imidazolyl group, an imidazolinyl group, a pyrazolyl group, a pyrazolinyl group, a pyrrolinyl group, a triazolyl group, a tetrazolyl group, a furfuryl group, and an isoxazolyl group.

3. The electrode composition as claimed in claim 1, wherein a weight average molecular weight of the compound including the moiety represented by Chemical Formula 1 is about 5,000 to about 200,000 g/mol.

4. The electrode composition as claimed in claim 1, wherein the compound represented by Chemical Formula 1 includes one or two substituents represented by Chemical Formula 2 per the moiety represented by Chemical Formula 1.

5. The electrode composition as claimed in claim 1, wherein the electrode composition includes:
about 60 to about 95 wt % of the conductive powder;
about 0.5 to about 20 wt % of the glass frit;
about 1 to about 20 wt % of the organic binder; and
a balance amount of the solvent.

6. The electrode composition as claimed in claim 1, wherein the glass frit includes at least one selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

7. The electrode composition as claimed in claim 1, wherein the solvent includes at least one selected from methyl cellosolve, ethyl cellosolve, butyl cellosolve, an aliphatic alcohol, α-terpineol, β-terpineol, dihydro-terpineol, ethylene glycol, ethylene glycol monobutyl ether, butyl cellosolve acetate, and 2,2,4-trimethyl-1,3-pentanediol monoisobutyrate.

8. The electrode composition as claimed in claim 1, wherein the glass frit has an average particle diameter (D50) of about 0.1 μm to about 10 μm.

9. The electrode composition as claimed in claim 1, further comprising at least one selected from a surface-treatment agent, a dispersing agent, a thixotropic agent, a plasticizer, a viscosity stabilizer, an antifoaming agent, a pigment, an ultraviolet stabilizer, an antioxidant, and a coupling agent.

10. An electrode manufactured using the electrode composition as claimed in claim 1.

11. A solar cell comprising the electrode as claimed in claim 10.

12. A method of manufacturing a solar cell, the method comprising:
applying the electrode composition as claimed in claim 1 onto a substrate; and
heating the composition to form an electrode on the substrate.

13. An electrode composition, comprising:
a conductive powder;
glass frit;
an organic binder; and
a solvent,
wherein the organic binder is a compound that includes a moiety represented by Chemical Formula 1:

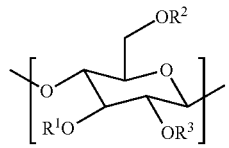

[Chemical Formula 1]

wherein, in Chemical Formula 1,
$R^1$, $R^2$, and $R^3$ are each independently selected from hydrogen, a substituted or unsubstituted linear or branched C1 to C15 alkyl group, a substituted or unsubstituted linear or branched C2 to C15 alkenyl group, a substituted or unsubstituted C3 to C20 cycloalkyl group, a substituted or unsubstituted C3 to C20 heterocycloalkyl group, a substituted or unsubstituted C3 to C20 aryl group, a substituted or unsubstituted C3 to C20 heteroaryl group, and a group represented by Chemical Formula 2, provided that at least one of $R^1$, $R^2$, and $R^3$ is a group represented by Chemical Formula 2:

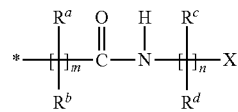

[Chemical Formula 2]

wherein, in Chemical Formula 2,
$R^a$, $R^b$, $R^c$, and $R^d$ are each independently hydrogen or a linear or branched C1 to C10 alkyl group,
m is an integer of 1 to 10,
n is an integer of 0 to 10,
X is selected from a substituted or unsubstituted linear or branched C1 to C18 alkyl group, a hydroxy group, a halogen, a carboxyl group, an ester group represented by —COOR, in which R is a linear or branched C1 to C6 alkyl group, a phosphoric acid group, a phosphoric acid ester group represented by —O—P(=O)(OR)$_2$, in which R is a linear or branched C1 to C6 alkyl group, a substituted or unsubstituted C3 to C20 cycloalkyl group, a substituted or unsubstituted C6 to C20 aryl group, and a substituted or unsubstituted 5-membered or 6-membered alicyclic group including N, O, S, or a combination thereof, and
* indicates a point where the substituent is linked to oxygen of $OR^1$, $OR^2$, or $OR^3$ of Chemical Formula 1,
provided that, in Chemical Formula 2, at least one substituted or unsubstituted methylene group (—(C($R^a$)($R^b$))— or —(C($R^c$)($R^d$))—) that is not adjacent to the amide group is replaced by a linking group selected from —O—, —S—, —S(=O)—, —C(=O)—O—, —O—C(=O)—, —C(=O)NR—, in which R is hydrogen or a C1 to C6 alkyl group, and a combination thereof.

14. An electrode manufactured using the electrode composition as claimed in claim 13.

15. A solar cell comprising the electrode as claimed in claim 14.

16. A method of manufacturing a solar cell, the method comprising:
applying the electrode composition as claimed in claim 13 onto a substrate; and heating the composition to form an electrode on the substrate.

* * * * *